(12) United States Patent
Trivedi

(10) Patent No.: US 6,436,805 B1
(45) Date of Patent: *Aug. 20, 2002

(54) LOCAL INTERCONNECT STRUCTURES AND METHODS FOR MAKING THE SAME

(75) Inventor: Jigish D. Trivedi, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/388,832

(22) Filed: Sep. 1, 1999

(51) Int. Cl.$^7$ .................. H01L 21/44; H01L 21/48; H01L 21/50
(52) U.S. Cl. .................. 438/618; 438/682; 438/683
(58) Field of Search ................ 438/618, 682, 438/683

(56) References Cited

U.S. PATENT DOCUMENTS

| | | |
|---|---|---|
| 5,340,774 A | 8/1994 | Yen |
| 5,477,074 A | 12/1995 | Yen |
| 5,512,516 A | 4/1996 | Nishida et al. |
| 5,573,980 A * | 11/1996 | Yoo |
| 5,721,146 A | 2/1998 | Liaw et al. |
| 5,756,394 A | 5/1998 | Manning |
| 5,847,463 A | 12/1998 | Trivedi et al. |
| 5,888,894 A | 3/1999 | Kong et al. |
| 5,893,741 A * | 4/1999 | Huang |
| 5,895,961 A | 4/1999 | Chen |
| 5,897,372 A | 4/1999 | Howard |
| 5,913,139 A | 6/1999 | Hashimoto et al. |
| 5,918,147 A | 6/1999 | Filipiak et al. |
| 5,920,796 A | 7/1999 | Wang et al. |
| 5,928,732 A | 7/1999 | Law et al. |
| 6,281,101 B1 * | 8/2001 | Iyer |

OTHER PUBLICATIONS

US 5,904,534, 05/1999, Cheek et al. (withdrawn)

* cited by examiner

Primary Examiner—David L. Talbott
Assistant Examiner—David A. Zarneke
(74) Attorney, Agent, or Firm—Klarquist Sparkman, LLP

(57) ABSTRACT

The present invention provides methods of forming local interconnect structures for integrated circuits. A representative embodiment includes depositing a silicon source layer over a substrate having at least one topographical structure thereon. The silicon source layer preferably comprising silicon rich silicon nitride, silicon oxynitride or other silicon source having sufficient free silicon to form a silicide but not so much free silicon as to result in formation of stringers (i.e., does not comprise polysilicon). The silicon source layer is preferably deposited over an active area in the substrate and at least a portion of the topographical structure. A silicide forming material, e.g., a refractory metal, is deposited directly on selected regions of the silicon source layer and over the topographical structure. A silicide layer is made from the silicide forming material and the silicon source layer preferably by annealing the structure. The silicide layer defines a portion of the local interconnect structure, unreacted silicide forming material is removed and an interlevel dielectric is formed over the silicide layer. The interlevel dielectric includes a recess defined substantially over the active area and an electrically conductive material is deposited in the recess. The present invention also provides local interconnect structures.

43 Claims, 7 Drawing Sheets

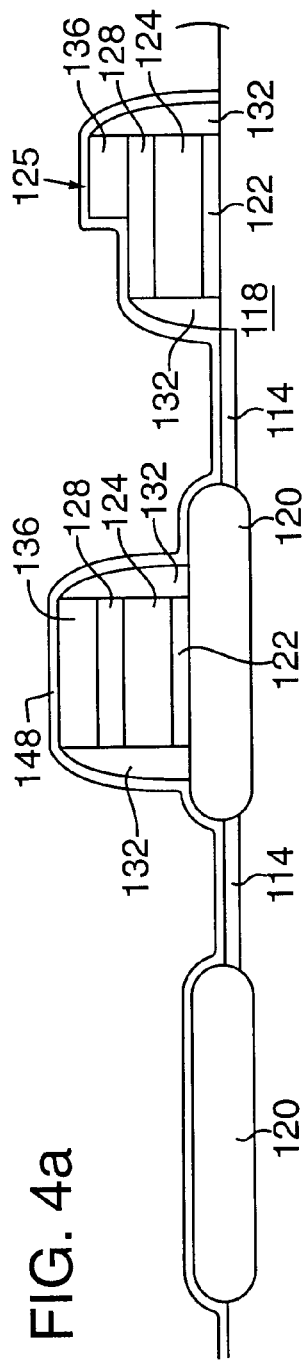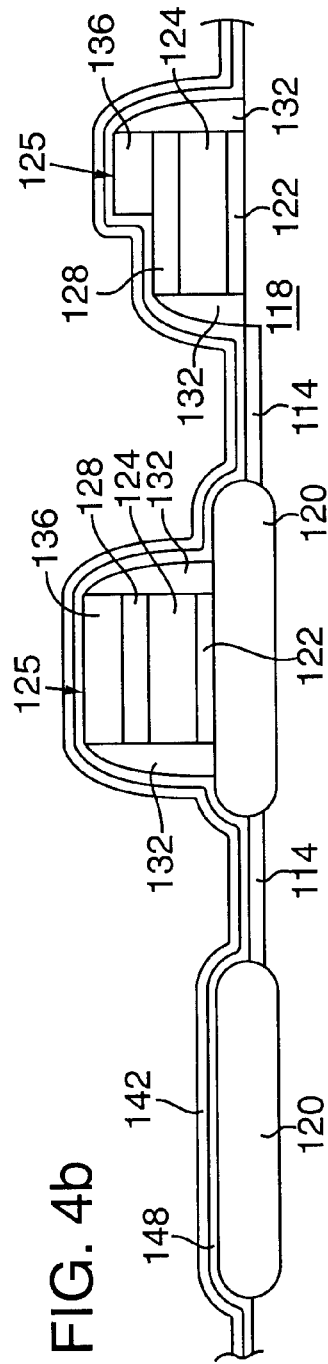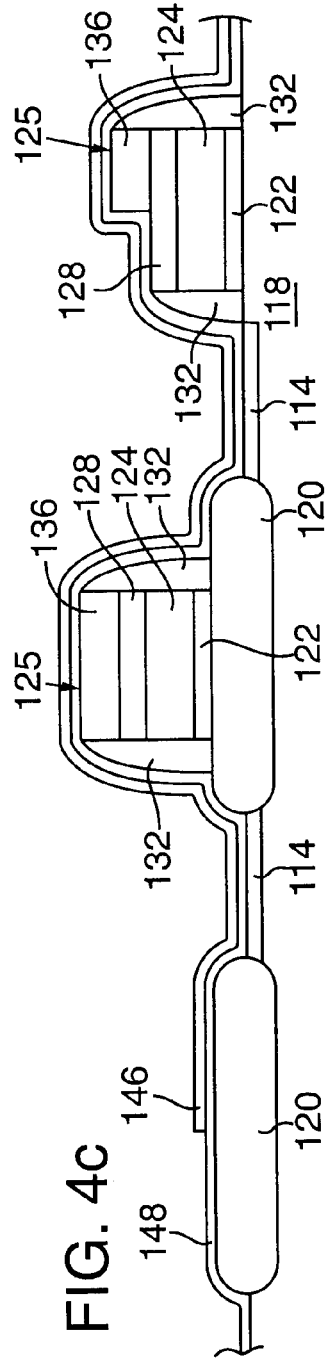

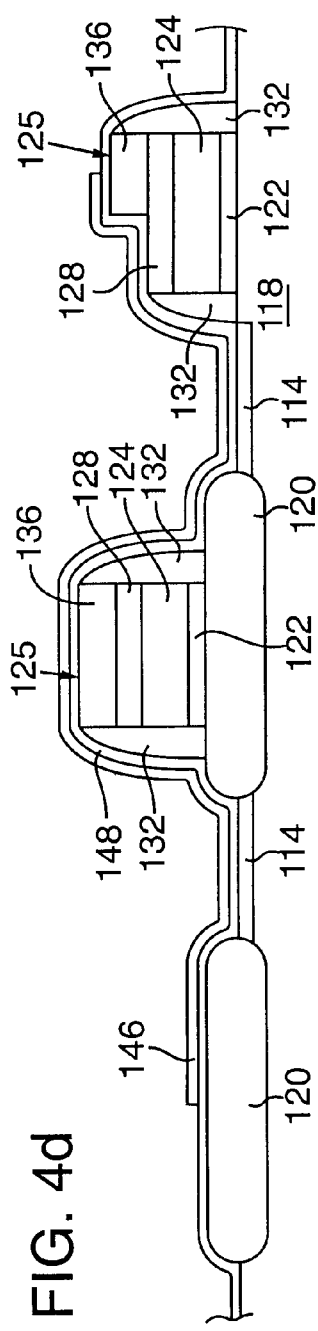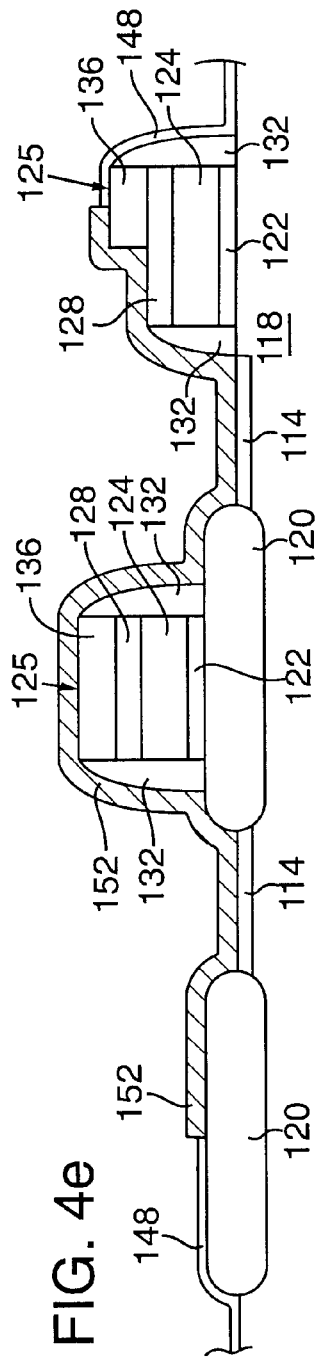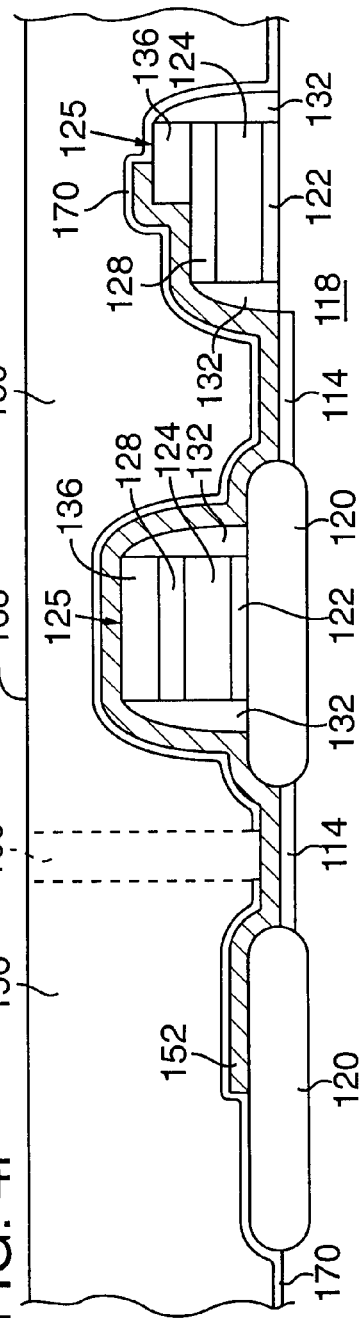

LOCAL INTERCONNECT STRUCTURES AND METHODS FOR MAKING THE SAME

FIELD OF THE INVENTION

The present invention relates to local interconnect structures in an integrated circuit, and methods for making the same.

BACKGROUND OF THE INVENTION

A continuing trend in semiconductor technology is to build integrated circuits with more and faster semiconductor devices. The drive toward this ultra large-scale integration has resulted in a continued shrinking of device and circuit features. To take advantage of an increasing number of devices and to form the devices into one or more circuits, the various devices must be interconnected.

Ultra-large scale integrated circuit technology includes the formation of isolated semiconductor devices formed within the surface of silicon wafers and interconnecting these devices with wiring layers above the surface. The interconnection system typically consists of two or more levels of interconnection metallurgy, separated by insulation layers. The first level of interconnection is used to define small fundamental circuits, e.g., a basic CMOS inverter requiring that the gates on NMOS and PMOS devices are connected together. Memory cells such as 6T SRAM, in particular, require several such local interconnections.

To accomplish interconnection on such a small scale, a local interconnect is typically used within an integrated circuit to provide an electrical connection between two or more conducting or semiconducting regions (e.g., active regions of one or more devices). More specifically, local interconnects are routing-restricted interconnect levels used for the short metallization runs, such as those that locally interconnect gates and drains in NMOS and CMOS circuits and those that connect a given metallization layer to a particular structure within the integrated circuit.

Local interconnects are typically formed of low resistance material, such as a conductor or a doped semiconductor that is formed to electrically couple selected regions. A commonly used technique for forming local interconnects is the Damascene process. In this process a first metal is inlaid into a dielectric layer. This involves first depositing the dielectric layer and then polishing via chemical mechanical polishing (CMP) to make the layer planar. The structure is then patterned and etched to form recessed trenches in the dielectric layer where conductive metal lines are to be deposited. Contact to the underlying devices is made where the trenches pass over the active device regions; elsewhere the dielectric layer insulates the metal from the substrate. Generally, a sandwich structure of titanium (Ti), titanium nitride (TiN), and tungsten is next deposited in the trench and onto the dielectric surface. A second CMP is then used to remove the conductive materials from the dielectric surface, leaving metal in the trench. The CMP step is followed by a next level of interlevel dielectric (ILD) deposition, contact patterning and etching, and a filling with a conductive metal. Due to time and associated costs, it is undesirable to require two CMP processes to form a local interconnect structure.

Other methods for forming local interconnects have been used in effort to avoid the multiple CMP processing steps required by the Damascene technique. Such methods use a polycrystalline silicon (polysilicon) layer as a silicon source layer. Typically, titanium (or titanium nitride, $Ti_xN_y$, wherein y is less than about 0.12) is deposited over a device. Polysilicon is then deposited as a uniform layer over the titanium. An interconnect pattern is formed thereon and portions of the polysilicon layer are removed. The device is then annealed so that the titanium in contact with the polysilicon forms a titanium silicide. The remaining titanium (that did not react with the polysilicon) is removed. Theoretically, this process allows formation of self-aligned local interconnects. In practice, however, titanium that does not overly the polysilicon source layer nonetheless typically leaches silicon (i.e., reacts with free silicon) from those portions of the polysilicon source layer that are adjacent the titanium resulting in the formation of stringers. Stringers cause electrical shorting between devices.

SUMMARY OF THE INVENTION

To overcome the deficiencies in the prior art, the present invention provides local interconnect structures that are free of stringers. The present invention also provides methods for making such local interconnect structures wherein the methods do not require two or more CMP processing steps. Because local interconnect structures form electrical connections of relatively short distances (typically about 0.5 μm to about 10 μm), the material forming the local interconnects need not possess a low resistance value (as compared to materials forming electrical interconnections of greater distances (i.e., typically distances greater than 10 μm)). Accordingly, materials other than polycrystalline silicon are used in the present invention to form a silicon source layer for fabrication of local interconnect structures.

The present invention provides methods for forming a local interconnect structures for integrated circuits. In a representative method, a substrate having a surface and including at least one topographical structure thereon (such that a region of the surface of the substrate is exposed) is provided. An active area is preferably formed in the substrate prior to formation of the topographical structure. A thin silicon source layer is then deposited over at least a portion of the active area. The silicon source layer preferably comprises silicon rich silicon nitride, silicon oxynitride or other silicon source having sufficient free silicon to form a silicide but not so much free silicon as to result in formation of stringers (as occurs with the use of polysilicon). A silicide forming material, such as a refractory metal, is deposited directly upon selected regions of the silicon source layer and over the topographical structure. The structure is then preferably annealed to form a silicide layer from the refractory metal and silicon source layer. The silicide layer creates a portion of the local interconnect structure. Remaining non-reacted silicide forming material (e.g., regions of the silicon source layer not in direct, intimate contact with the silicide forming material) is removed and an interlevel dielectric is deposited over the silicide layer. The interlevel dielectric includes at least one recess defined substantially over the active area. An electrically conductive material is deposited in the recess to complete the local interconnect structure.

According to another representative embodiment a method of forming a local interconnect structure for an integrated circuit is provided wherein a silicide forming material, e.g., a refractory metal, is deposited prior to deposition of a silicon source layer. The silicon source layer preferably comprises silicon rich silicon nitride, silicon oxynitride or other silicon source having sufficient free silicon to form a silicide but not so much free silicon as to result in formation of stringers. The silicon source layer is deposited over the refractory metal and is patterned and etched to form a hard mask. The remainder of the method is essentially identical to the representative embodiment set forth above.

According to another aspect of the present invention, local interconnect structures are provided. A representative embodiment of the local interconnect structure preferably includes a substrate having at least one topographical structure, such as a gate stack. At least one active area is adjacent to the topographical structure. Silicon source overlays a portion of the substrate and a portion of the topographical structure. A silicide layer covers at least a portion of the active area and extends over a portion of the topographical structure thereby forming a portion of the local interconnect structure. An oxide layer preferably overlays the silicon source but not the silicide layer. A passivation layer covers the oxide layer and the silicide layer. The passivation layer includes at least one recess that extends through the passivation layer and terminates substantially at the active area. An electrically conductive material substantially fills the recess to form an electrical contact with the silicide layer and the active area.

BRIEF DESCRIPTION OF THE DRAWINGS

FIGS. 4a–4f show, in cross-section, another method of manufacture and a resulting local interconnect structure according to another embodiment of the present invention.

DETAILED DESCRIPTION OF THE INVENTION

A first method of manufacture of an embodiment of a local interconnect structure according to the present invention is described with reference to FIGS. 1a–1e and FIG. 2.

Although the present invention is described primarily with reference to transistors as forming a part of the local interconnect structure, it should be understood that the local interconnect structures and manufacturing methods of the present invention apply equally well to any semiconductor device or integrated circuit requiring one or more local interconnects. For example, one application of the local interconnect structure of the present invention may be the formation of electrical interconnection between a transistor gate stack and a contact to an adjacent active area in a semiconductor substrate.

Figure 1A:
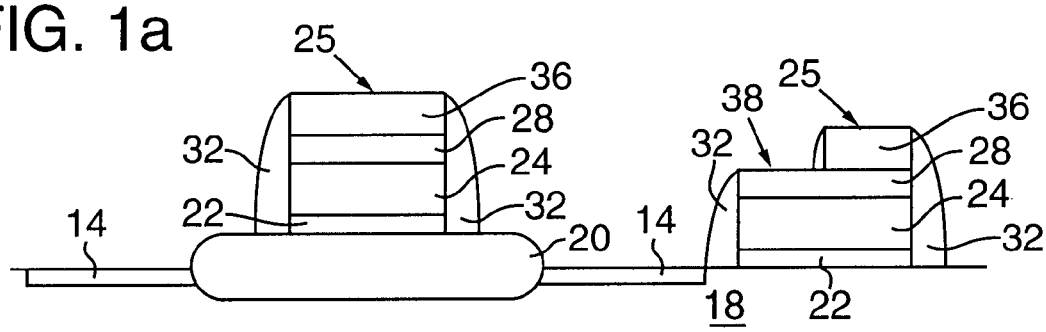
FIGS. 1a–1e show, in cross-section, a method of manufacture and a resulting local interconnect structure according to an embodiment of the present invention.

FIG. 1a illustrates a typical beginning structure for making a local interconnection structure 10 (FIG. 3) of the present invention. The beginning structure may include a semiconductor or wafer substrate 18 with at least one active region 14 defined in the substrate 18. The substrate 18 may comprise silicon, gallium arsenide, glass, an insulating material such as sapphire, or any other substrate material upon which an integrated circuit wafer may be fabricated. Active regions 14 are typically formed by doping specific portions of the wafer substrate 18 by conventional methods, such as ion implantation or diffusion. A field oxide or isolation region 20 is formed in the substrate 18. The field oxide or isolation region 20 may be formed by conventional means known to persons skilled in the art, such as by local oxidation of a silicon substrate or isolation diffusion of the substrate 18. Isolation region 20 forms p-n junctions that separate areas of the substrate 18. In other words, the isolation region 20, in part, serves the function of a dielectric to electrically isolate regions of the substrate 18.

Materials are deposited on the substrate 18 and selectively removed to form the desired topographical structure, such as a transistor gate stack 25. Although two complete gate stacks 25 are illustrated in FIGS. 1a–1e, there can be any number of gate stacks 25 or other various topographical structures formed upon the substrate 18. Gate stack 25 may comprise a gate oxide 22 having a transistor gate 24 that typically comprises a polysilicon layer. Overlying the transistor gate 24 may be a metal silicide layer 28 (or some other conductor layer). The refractory metal silicide 24 of the gate stack 25 typically comprises any refractory metal silicide including but not limited to titanium, cobalt, tungsten, tantalum, or molybdenum silicides.

Overlying the refractory metal silicide layer 28 is an insulating material cap 36, typically an oxide or nitride such as a tetraethoxysilane (TEOS) oxide. Each gate stack 25 may include one or more spacers 32. Spacers 32 are typically oriented perpendicular to the substrate 18 on either side of the gate stack 25. Spacers 32 may be formed by subjecting a layer of silicon nitride (not shown) deposited over the gate stack 25 to an anisotropic etch (a technique well known to persons skilled in the art). Alternatively, spacers 32 may be made of undoped silicon dioxide.

As shown with the gate stack 25 positioned on the right side of the structure shown in FIG. 1a, a selected portion of the cap 36 may be removed (e.g., by dry etch) to allow access to the transistor gate 24 via the metal silicide layer 28. Alternatively, the cap 36 may be initially deposited such that a portion of the metal silicide layer 28 is exposed to allow access to the transistor gate 24.

Figure 1B:
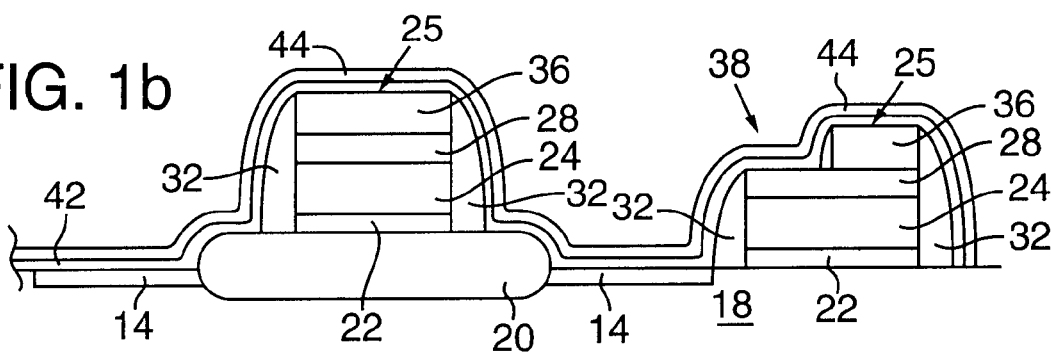

Referring to FIG. 1b, a silicon source layer 42 is deposited uniformly over the structure. Silicon source layer 42 preferably comprises silicon-rich silicon nitride or silicon oxynitride. Silicon-rich silicon nitride may be deposited by any method, but is preferably deposited by LPCVD. Likewise, silicon oxynitride may be deposited as a silicon source layer 42 by any method, but is preferably deposited by PECVD using a reactant gas mixture of silane, nitrous oxide, ammonia, and nitrogen. The silicon source layer 42 preferably has a thickness of from about 150 Å to about 400 Å and more preferably from about 150 Å to about 200 Å.

Stoichiometric silicon is $Si_3N_4$. As used herein, stoichiometric means that the composition is such that the ratio of elements forms a neutrally charged compound. Silicon-rich silicon nitride and silicon oxynitride are examples of non-stoichiometric materials. It is preferable that the silicon source layer 42 have sufficient silicon concentration to form the necessary silicide (i.e., so that the silicide is sufficiently electrically conductive) but not too much silicon as to cause stringer formation during the silicide process. Accordingly, the approximate stoichiometries for the silicon-rich silicon nitride or silicon oxynitride are preferably equal to $Si_xN_yO_z$ wherein x is about 0.39 to about 0.65, y is about 0.02 to about 0.56, and z is about 0.05 to about 0.33.

Figure 1C:
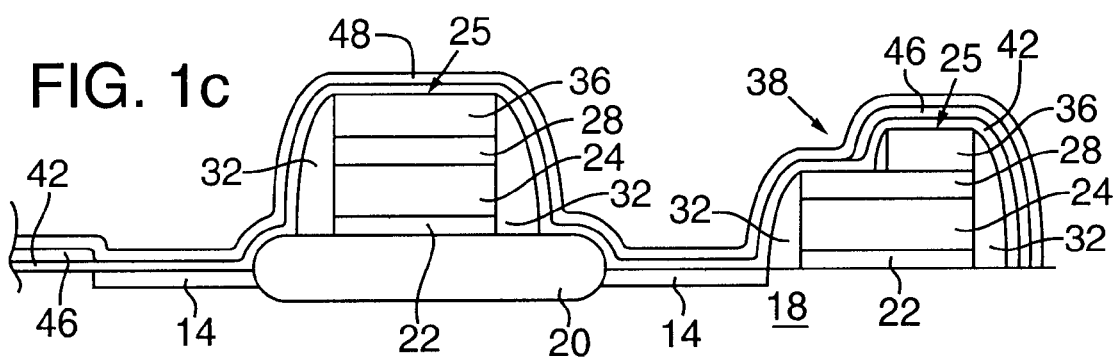

Continuing to refer to FIG. 1b, a thin film 44 is uniformly deposited over the silicon source layer 42. Thin film 44 will be selectively removed to form a hard mask 46 as shown in FIG. 1c (discussed below). Thin film 44 may comprise any suitable insulating material that is not rich in silicon (i.e., without free silicon). Thin film 44 preferably comprises TEOS, $Si_3N_4$ or silicon oxynitride rich in oxygen and may be deposited by any suitable manner, such as by CVD. Thin film 44 preferably has a thickness of from about 200 Å to about 400 Å.

After deposition, the thin film 44 is patterned such that portions of thin film 44 are exposed for removal to form hard mask 46. Patterned thin film 44 is etched using conventional etching techniques. Hard mask 46 assists in the selective removal of material during later etching processes (discussed below) and defines the local interconnect.

Referring to FIG. 1c, after the hard mask 46 is formed by etching the patterned thin film 44, portions of the silicon source layer 42 are left exposed. The hard mask 46 only covers portions of the silicon source layer 42 where local interconnects will not be formed and exposes portions of silicon source layer 42 where local interconnects are to be formed.

Continuing to refer to FIG. 1c, a uniform layer of a refractory metal 48 (or other electrically conductive, preferably silicide-forming material) is deposited on the hard mask 46 and on the exposed portions of the silicon source layer 42. Refractory metal 48 may be sputter deposited or may be deposited by any other suitable method. Refractory metal 48 preferably comprises titanium, titanium nitride ($Ti_xN_y$, wherein y is from about 0.01 to about 0.15), cobalt, or colbalt nitride. Refractory metal 48 is preferably deposited at a thickness of from about 300 Å to about 500 Å. The resulting structure is then annealed such that a metal silicide is formed.

Figure 1D:
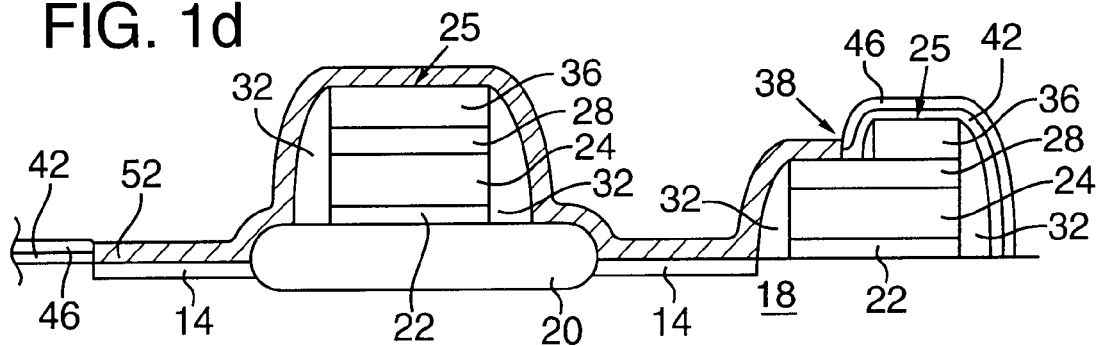

The structure as shown in FIG. 1c is preferably annealed using rapid thermal processing (RTP) in an $N_2/NH_3$ atmosphere at a temperature of from about 700° C. to about 850° C., and more preferably from about 700° C. to about 750° C. When the structure is annealed, refractory metal 48 that is in intimate, direct contact with the exposed portions of the silicon source layer 42 form metal silicide regions 52 (as shown in FIG. 1d). The portions of the silicon source layer 42 underlying the hard mask 46 do not react to form a silicide compound (but remain as silicon source layer material). Likewise the portions of refractory metal 48 overlying the hard mask 46 do not react to form a silicide compound. For example, if titanium nitride (wherein the titanium nitride is $Ti_xN_y$, y being equal to from about 0.01 to about 0.15) is deposited as refractory metal 48, those portions of the $Ti_xN_y$ layer in contact with the silicon source layer 42 will react during the anneal process to form a titanium silicide (e.g., $TiSi_xN_y$). Thus metal silicide regions 52 are formed only in those areas where the local interconnects are to be formed.

Referring to FIG. 1d, non-reacted refractory metal 48 is then removed from hard mask 46 using an etchant that is selective to the particular metal silicide. For example, when use of an etchant selective to titanium silicide is appropriate, non-reacted refractory metal 48 is preferably removed using a wet etch process, such as an etchant mixture comprising $NH_4OH/H_2O_2/H_2O$ (at a ratio of about 0.5:0.5:1). If refractory metal 48 comprises cobalt or a cobalt compound, a preferred etchant may comprise $HNO_3/H_2O_2/H_2O$ (at a ratio of about 0.5:0.5:1). Such an etchant mixture is selective to cobalt silicide.

Referring to FIG. 1d, the remaining silicon source layer 42 need not be removed as it is not a conductive material. Likewise, the hard mask 46 need not be removed. In some devices, it is preferable to have the hard mask 46 remain, as the hard mask may act as a protective layer for the active areas of the device.

Figure 1E:
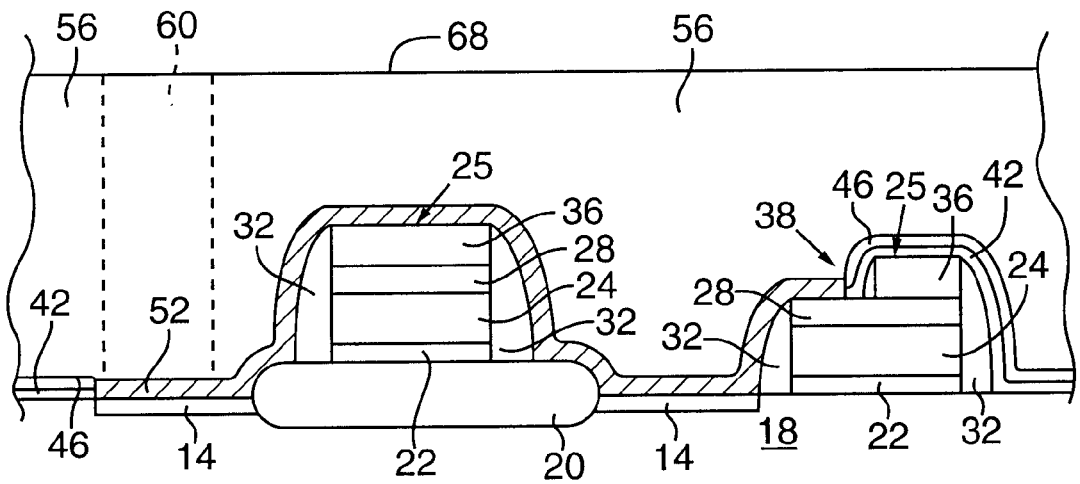

As illustrated in FIG. 1e, a passivation layer or interlevel dielectric (ILD) 56 is deposited over hard mask 46 and metal silicide regions 52. ILD 56 is typically a silica substantially comprising materials selected from a group consisting of silicon dioxide, borophosphosilicate glass (BPSG), phosphosilicate glass (PSG), doped or undoped oxides, and mixtures thereof. Once the ILD 56 is deposited, it is preferable to planarize the uppermost surface 68 of the local interconnect structure 10 by a suitable process, such as chemical mechanical polishing (CMP).

A recess 60 is then patterned on the ILD 56 and the ILD is removed as illustrated by phantom lines in FIG. 1e. Recess 60 (i.e., an electrical contact hole) is formed in the ILD 56 adjacent to the gate stack 25 and is generally aligned with the active area 14. As used herein, "generally aligned with a selected active area" is intended to mean positioned substantially perpendicular to a location where the active area 14 is situated within the substrate 18. Although only a single recess 60 is illustrated in FIG. 1e, multiple recesses may be formed in the passivation layer to form electrical connection to a selected active area 14. The etchant used to remove selected portions of ILD 56 to form recess 60 may be isotropic or anisotropic, but is preferably selective to the metal silicide 52. A typical etchant comprises $CHF_3$, $CF_4$, Ar, or a mixture thereof.

Figure 3:
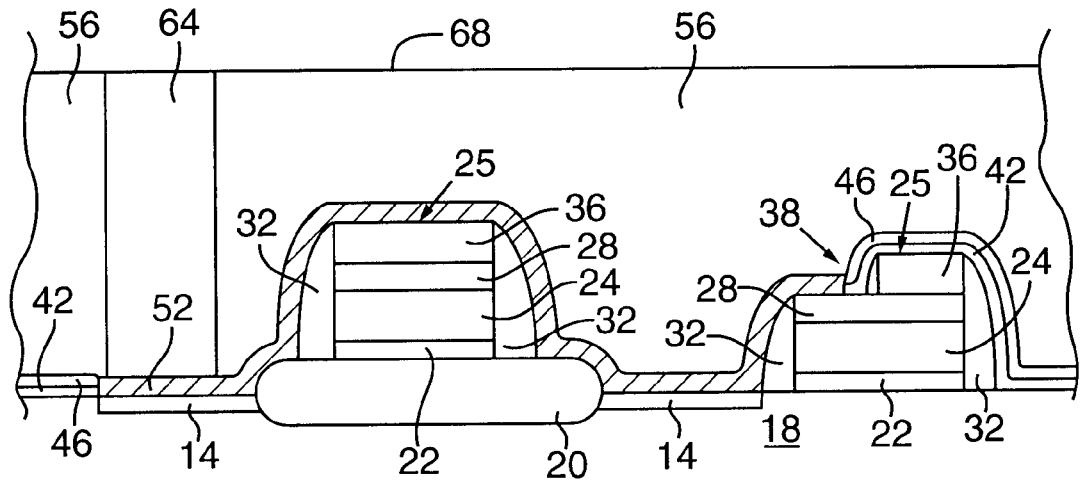
FIG. 3 is a cross-sectional view of an embodiment of the local interconnect structure of the present invention.
Figure 2:
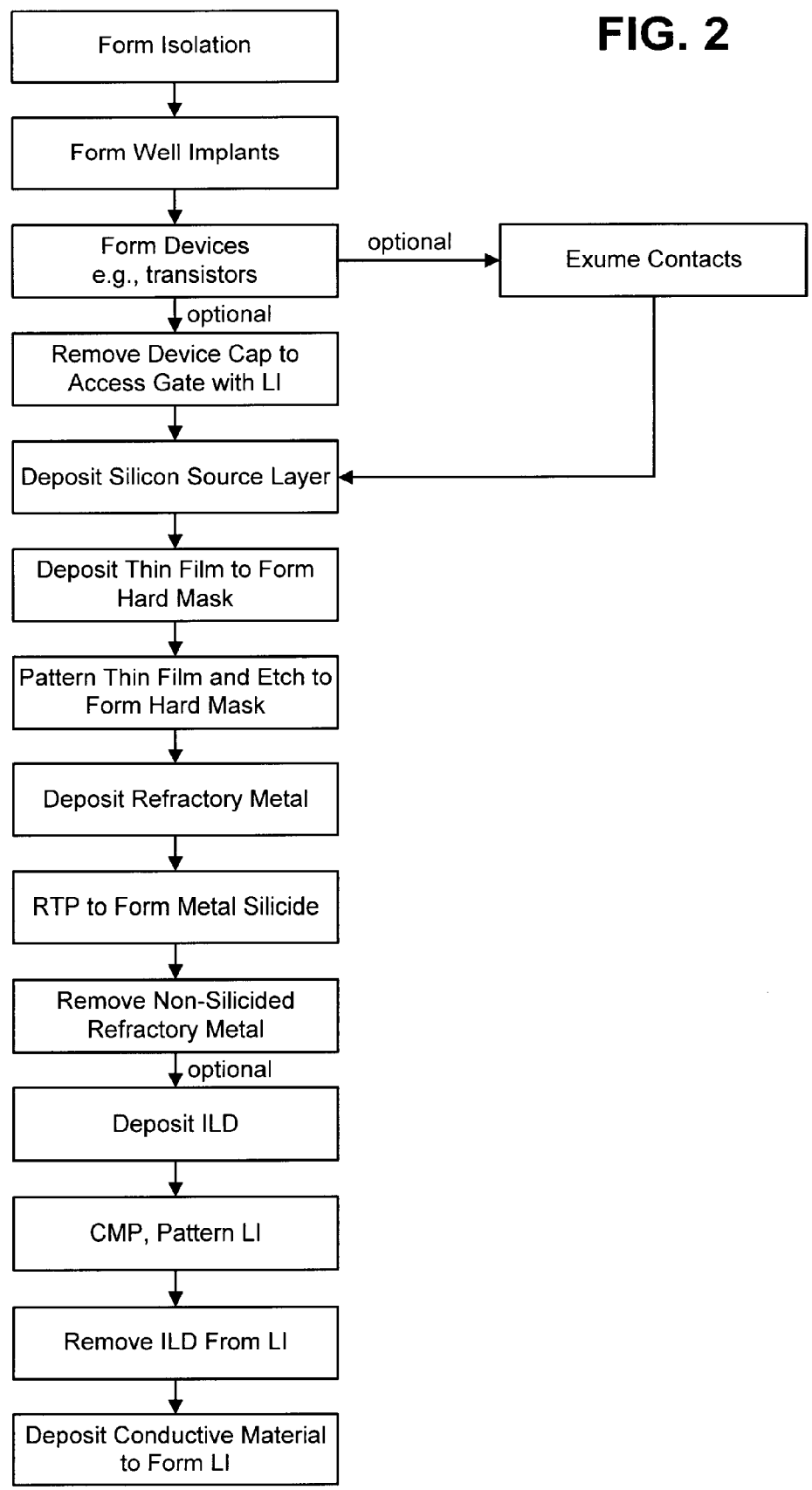
FIG. 2 is a process flow diagram of the method shown in FIGS. 1a–1e.
Figure 5:
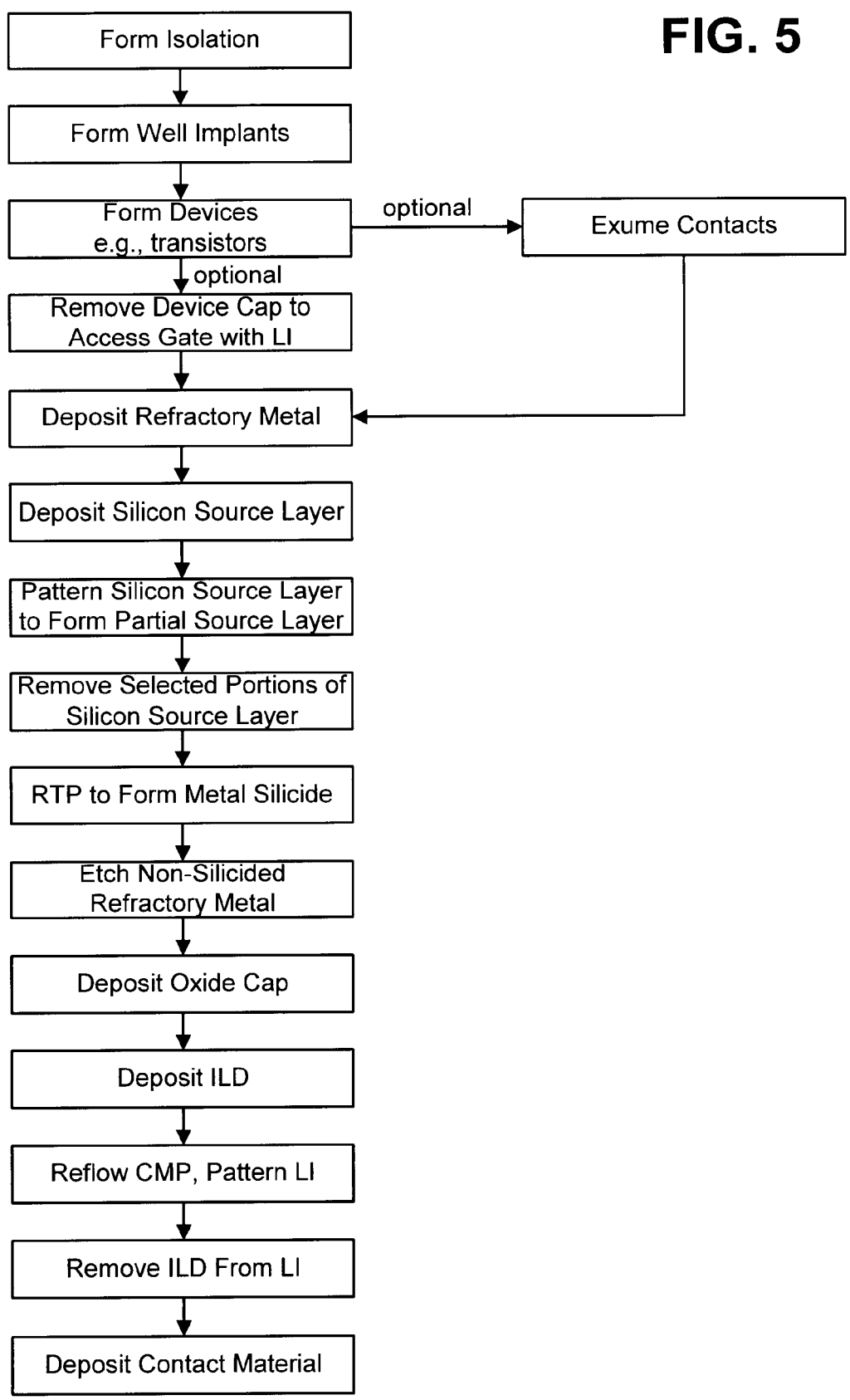
FIG. 5 is a process flow diagram of the method shown in FIGS. 4a–4f.

An electrically conductive layer is then applied to fill recess 60 and complete an electrical contact 64 to the corresponding active area 14 through the corresponding metal silicide region 52 (FIG. 3). Electrical contact 64 typically comprises suitable electrically conductive materials, such as aluminum, copper, tungsten, or other suitable conductor materials.

As shown in FIG. 3, the local interconnect structure 10 made according to the above-described method comprises a substrate 18 having active areas 14 and isolation region 20 formed therein. Topographical substructures, such as gate stacks 25 for formation of MOSFETs, are included according to the specific needs of the ultimate device to be made (e.g., a memory device). The local interconnect structure 10 of the present invention further includes metal silicide regions 52 forming electrical connecting portions of the local interconnects. Non-conductive silicon source layer portions 42 are located immediately adjacent the metal silicide regions 52. Hard mask 46 covers the silicon source layer portions 42 and ILD 56 covers the hard mask 46 and metal silicide regions 52 with the exception of those metal silicide regions located directly above active areas 14 at the electrical contact 64. Electrical contact 64 extends from the uppermost surface 68 of the local interconnect structure 10 to the metal silicide region 52 overlying the active area 14.

At this point, local interconnect structure 10 (as shown in FIG. 3) of the present invention is complete. Local interconnect structure 10 of the present invention may now undergo conventional processing depending upon specific needs, such as further processing to form a memory device.

Figure 6:
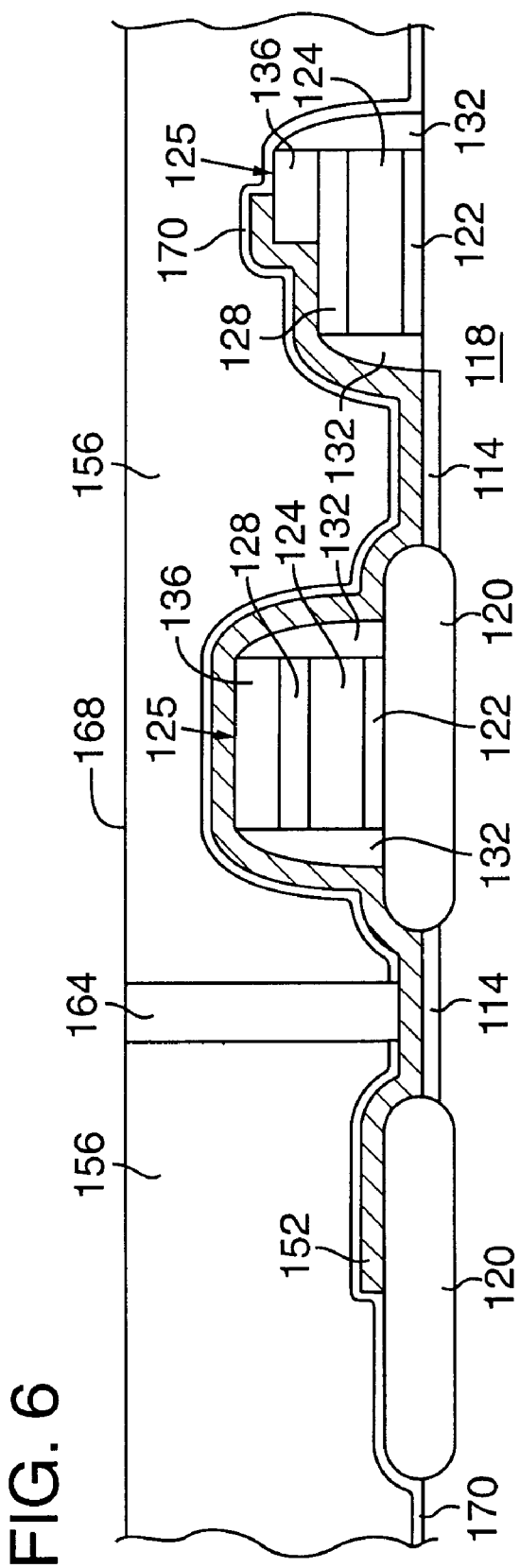
FIG. 6 is a cross-sectional view of another embodiment of the local interconnect structure of the present invention.

Another method of manufacture of another embodiment of the local interconnect structure 110 (as shown in FIG. 6) of the present invention is described with reference to FIGS. 4a–4f and FIG. 5.

Referring to FIG. 4a, as with the above-described embodiment, a semiconductor or wafer substrate 118 includes one or more active regions 114 defined in the substrate. The substrate 118 may comprise silicon, gallium arsenide, glass, an insulating material such as sapphire, or any other substrate material upon which an integrated circuit wafer may be fabricated. Active regions 114 are typically formed by doping specific portions of the substrate 118, as described above. One or more field oxide or isolation regions 120 are formed in the substrate 118, also as described above with reference to the first method.

Materials are deposited on the substrate 118 and selectively removed to form a desired topographical structure, such as one or more transistor gate stacks 125. Although two complete gate stacks 125 are illustrated in FIGS. 4a–4f and FIG. 6, there may be any number of gate stacks 125 or any number of a variety of topographical structures formed upon the substrate 118. Gate stack 125 may comprise a gate oxide 122 having a transistor gate 124, typically comprising a polysilicon layer. Overlying the transistor gate 124 is a conductive layer 128, e.g., a refractory metal silicide layer. The conductive layer 128 typically comprises a refractory metal silicide including but not limited to titanium, tungsten, tantalum, or molybdenum silicide, e.g., tungsten silicide ($WSi_x$).

Overlying the conductive layer 128 of the gate stack 125 is an insulating-material cap 136. Insulating cap 136 typically comprises an oxide or nitride such as a tetraethoxysilane (TEOS) oxide layer. Each gate stack 125 may include one or more spacers 132 formed immediately adjacent the stacks, as described above and as shown in FIG. 4a and FIG. 6.

As shown with the gate stack 125 positioned on the right side of the structure shown in FIG. 4, a selected portion of the cap 136 may be removed (e.g., by dry etch) to allow access to the transistor gate 124 via the conductive layer 128. Alternatively, the cap 136 may be initially deposited such that a portion of the conductive layer 128 is exposed to allow access to the transistor gate 124.

Continuing to refer to FIG. 4a, a uniform layer of a refractory metal 148 (or other material capable of forming a silicide) is deposited over exposed portions of substrate 118, exposed portions of isolation regions 120, spacers 132, and caps 136. The refractory metal 148 may be sputter deposited or may be deposited by any other suitable method. The refractory metal 148 preferably comprises titanium, titanium nitride ($Ti_xN_y$), cobalt, or colbalt nitride. The refractory metal 148 is preferably deposited at a thickness of from about 300 Å to about 500 Å.

Referring to FIG. 4b, a silicon source layer 142 is deposited uniformly over the refractory metal 148. Silicon source layer 142 preferably comprises a silicon-rich silicon nitride film or a silicon oxynitride film (each compound having stoichiometries substantially as described above in reference to the embodiment shown in FIGS. 1b–1e). Silicon source layer 142 should have sufficient free silicon concentration to form the necessary silicide (i.e., so that the silicide is sufficiently electrically conductive) but not so much free silicon as to cause stringer formation during the silicide process (such as occurs when using polysilicon). Silicon-rich silicon nitride or silicon oxynitride may be deposited as described above in relation to the first embodiment or by any other suitable deposition techniques as known to persons skilled in the art. The silicon source layer 142 preferably has a thickness of from about 150 Å to about 400 Å and more preferably from about 150 Å to about 200 Å.

Silicon source layer 142 is patterned and selectively removed (as shown in FIG. 4c) to form partial source layer 146. That is, silicon source layer 142 is patterned such that removal of portions of the source layer forms partial source layer 146 (i.e., a hard mask), which in turn defines the location(s) of the local interconnect. Referring to FIG. 4c, the portions of silicon source layer 142 that are then removed are those portions where local interconnection is not needed. The selected portions of the silicon source layer 142 may be removed using conventional etchants and etch methods, but are preferably removed using an etchant that is selective to the refractory metal 148 (e.g., by dry etch).

The structure as shown in FIG. 4d is preferably annealed using RTP in an $N_2/NH_3$ atmosphere at a temperature of from about 700° C. to about 850° C., and more preferably at from about 700° C. to about 750° C. When the structure is annealed, refractory metal 148 in contact with the partial source layer 146 form metal silicide regions 152 (as shown in FIG. 4e). The portions of the exposed refractory metal 148 (i.e., those portions of refractory metal 148 wherein the silicon source layer 142 overlying it was removed as described above) do not form a silicide compound (i.e., remain as refractory metal and refractory metal nitride) except those portions in direct contact with the silicon substrate 118 (i.e., at the active areas and local interconnect areas). For example, if $Ti_xN_y$ is deposited as refractory metal 148, those portions of the titanium or titanium nitride layer in intimate and direct contact with the partial source layer 146 will form a titanium silicide (e.g., $TiSi_xN_y$) while those portions not directly in contact with partial source layer 146 will remain as titanium or titanium nitride. Thus, metal silicide regions 152 are formed only in those areas in which the local interconnects are to be formed.

Referring to FIG. 4f, non-reacted refractory metal 148 is then etched from the structure. The etchant used is selective to the materials comprising exposed portions of the topographical structures (i.e., spacers 132, cap 136, isolation regions 120, and substrate 118). An oxide cap 170 is deposited uniformly over exposed portions of the topographical structures (i.e., spacers 132, cap 136, isolation regions 120, and substrate 118) and over metal silicide regions 152. Oxide cap 170 may comprise a layer of oxide that provides a protective cap and is preferably from about 300 Å to about 400 Å in thickness.

As illustrated in FIG. 4f, a passivation layer or interlevel dielectric (ILD) 156 is deposited over oxide cap 170. ILD 156 typically comprises a silica substantially comprising materials selected from a group consisting of silicon dioxide, borophosphosilicate glass (BPSG), phosphosilicate glass (PSG), doped or undoped oxides, and mixtures thereof, although other passivation materials may be used. Once the ILD 156 is deposited, it is preferable to planarize the uppermost surface 168 of the local interconnect structure 110 by a suitable process, such as CMP. Prior to or instead of CMP, the structure may be annealed at a temperature of about 750° C. to about 900° C. to reflow ILD 156, resulting in a relatively smooth top layer.

A recess 160 is then patterned on ILD 156 and the selected portion of ILD 156 is removed as illustrated by phantom lines in FIG. 4f. Recess 160 (i.e., contact hole) is formed in ILD 156 adjacent to gate stack 125 and is generally aligned with one or more selected active areas 114. That is, although only a single recess 160 is illustrated in FIG. 4f, multiple recesses may be formed in ILD 156 to form electrical connection to multiple selected active areas 114. The etchant used to remove selected portions of ILD 156 to form recess 160 may be isotropic or anisotropic but is preferably selective to the exposed portions of the structure described above. A typical etchant comprises $CHF_3$, $CHF_4$, or a mixture thereof.

An electrically conductive material is then deposited into recess 160 to complete formation of an electrical contact 164 to the active area 114 through the corresponding metal silicide region 152 (FIG. 6). Electrical contact 164 typically comprises an electrically conductive material, such as aluminum, copper, tungsten, or any other suitable conductor materials.

As shown in FIG. 6, the local interconnect structure 110 made according to the above-described method comprises a substrate 118 having active areas 114 and isolation regions 120 formed therein. Topographical substructures, such as gate stacks 125 of MOSFETs, are included according to the specific needs for the ultimate device to be made (e.g., a memory device). The local interconnect structure 110 of the present invention further includes metal silicide regions 152 forming electrical connecting portions of the local interconnects. Oxide cap 170 covers metal silicide regions 152 and the exposed portions of spacers 132, cap 136, isolation region 120, and substrate 118. Electrical contact 164 extends from the uppermost portion 168 of the local interconnect structure 110 to the metal silicide region 152 overlying the selected active area 114.

At this point, local interconnect structure 110 (as shown in FIG. 6) of the present invention is complete. Local interconnect structure 110 of the present invention may now undergo conventional processing depending upon specific needs, such as further processing to form a memory device.

Whereas the invention has been described with reference to multiple embodiments of the local interconnect structure and representative methods, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method of forming a local interconnect structure for an integrated circuit comprising:
    providing a substrate having a surface and including at least one topographical structure thereon such that a region of the surface of the substrate is exposed;
    forming at least one active area in the substrate;
    forming a silicon source layer over the at least one active area and at least a portion of the at least one topographical structure, wherein the silicon source layer does not comprise polysilicon;
    depositing a refractory metal directly on selected regions of the silicon source layer and over the at least one topographical structure;
    forming a silicide layer from the refractory metal and silicon source layer, the silicide layer defining a portion of the local interconnect structure;
    removing the refractory metal;
    forming an interlevel dielectric over the silicide layer, the interlevel dielectric having a recess defined substantially over the at least one active area; and
    depositing an electrically conductive material in the recess.

2. The method of claim 1, wherein the silicon source layer is selected from the group consisting essentially of silicon rich silicon nitride, silicon oxynitride, and mixtures thereof.

3. The method of claim 1, wherein the silicon source layer comprises $Si_xN_yO_z$ wherein x is about 0.39 to about 0.65, y is about 0.02 to about 0.56, and z is about 0.05 to about 0.33.

4. The method of claim 1, wherein the refractory metal is selected from the group consisting essentially of titanium, titanium nitride, cobalt, cobalt nitride, and mixtures thereof.

5. The method of claim 4, wherein the refractory metal is $Ti_xN_y$, wherein y is from about 0.01 to about 0.15.

6. The method of claim 1, wherein the refractory metal is removed using an etchant that is selective to the refractory metal silicide.

7. A method of forming a local interconnect structure for an integrated circuit comprising:
    providing a substrate having an exposed surface portion and an exposed active area;
    depositing a silicon source layer over the active area and exposed surface portion;
    forming a thin film over the silicon source layer;
    patterning and removing selected regions of the thin layer to expose regions of the silicon source layer to define a local interconnect pattern on the silicon source layer;
    depositing a silicide forming material on exposed regions of the silicon source layer;
    reacting the silicide forming material with the exposed regions of the silicon source layer to form a silicide layer as part of the local interconnect structure;
    removing the silicide forming material;
    forming an interlevel dielectric over the silicide layer, the interlevel dielectric having a recess defined therein and substantially aligned with and extending to the active area; and
    depositing an electrically conductive material in the recess.

8. The method of claim 7, wherein the silicon source layer is selected from the group consisting essentially of silicon rich silicon nitride, silicon oxynitride, and mixtures thereof.

9. The method of claim 7, wherein the silicon source layer comprises $Si_xN_yO_z$ wherein x is about 0.39 to about 0.65, y is about 0.02 to about 0.56, and z is about 0.05 to about 0.33.

10. The method of claim 7, wherein the thin film comprises a hard mask.

11. A method of forming a local interconnect structure for an integrated circuit comprising:
    providing a substrate having a principal surface including at least one topographical structure thereon such that a substrate region of the principal surface is exposed;
    forming at least one active area in the substrate adjacent the at least one topographical structure;
    forming a silicon source layer over the substrate region of the principal surface;
    forming a hard mask on selected silicon source layer regions such that the silicon source layer regions that form part of the local interconnect structure remain exposed;
    forming a refractory metal over the hard mask and on the silicon source layer regions;
    annealing to form a portion of the local interconnect structure;
    removing refractory metal from the hard mask;
    forming an interlevel dielectric over the portion of the local interconnect structure and the hard mask, the interlevel dielectric having a recess defined therein and substantially aligned with the active area or the topographical structure; and
    depositing an electrically conductive material in the recess.

12. The method of claim 11, wherein the silicon sources layer does not comprise polysilicon.

13. The method of claim 11, wherein the resulting local interconnect structure is substantially free of stringers.

14. A method of manufacturing a semiconductor device comprising:
    providing a substrate having a principal surface including at least one gate stack formed thereon such that a region of the principal surface of the substrate is exposed;

forming an active area in the substrate immediately adjacent the gate stack;

forming a silicon source layer over at least a portion of the active area and over at least a portion of the gate stack;

depositing a refractory metal on selected regions of the silicon source layer;

creating a silicide layer from the refractory metal and silicon source layer, the silicide layer forming a portion of a local interconnect structure;

forming a passivation layer on the silicide layer and silicon source layer, the passivation layer having a recess formed therein, the recess being substantially aligned with a portion of the silicide layer; and depositing an electrically conductive material in the recess.

15. The method of claim 14, wherein the silicide layer is formed by an annealing process.

16. A method of manufacturing an integrated circuit comprising: forming an active area in a substrate;

forming a topographical device on the substrate;

forming a silicon source layer over a surface of the substrate and over at least a portion of the topographical structure, the silicon source layer comprising a material selected from the group consisting essentially of silicon rich silicon nitride, silicon oxynitride, and mixtures thereof;

forming a hard mask on the silicon source layer to define a local interconnect pattern thereon;

depositing a uniform layer of a refractory metal on the silicon source layer and on the hard mask;

forming a refractory metal silicide layer;

removing refractory metal overlying the hard mask;

forming an interlevel dielectric over the silicide layer and hard mask, the interlevel dielectric having a recess defined substantially over the active area or a portion of the topographical structure; and depositing an electrically conductive material in the recess.

17. The method of claim 16, wherein the refractory metal is selected from the group consisting essentially of titanium, titanium nitride, cobalt, cobalt nitride, and mixtures thereof.

18. The method of claim 16, wherein the refractory metal is $Ti_xN_y$, wherein y is equal to about 0.01 to about 0.15.

19. The method of claim 16, wherein the silicon source layer is selected from the group consisting essentially of silicon rich silicon nitride, silicon oxynitride, and mixtures thereof.

20. A method of manufacturing a semiconductor device comprising:

providing a substrate having at least one gate stack formed thereon such that a region of the substrate is exposed;

forming 1at least one active area in the substrate adjacent the at least one gate stack;

removing a portion of the at least one gate stack to provide electrical access to a gate in the at least one gate stack;

forming a silicon source layer over the at least one active area and over at least a portion of the at least one gate stack;

depositing a refractory metal on selected regions of the silicon source layer;

creating a silicide layer from the refractory metal and silicon source layer, the silicide layer forming a portion of a local interconnect structure;

forming a passivation layer on the silicide layer, the passivation layer having recesses formed therein, the recesses being substantially aligned with the at least one active area or the at least one gate stack; and depositing an electrically conductive material in the recesses.

21. The method of claim 20, wherein a hard mask is deposited on selected portions of the silicon source layer prior to deposition of the refractory metal.

22. The method of claim 20, wherein the silicon source layer is selected from the group consisting essentially of silicon rich silicon nitride, silicon oxynitride, and mixtures thereof.

23. A method of forming a local interconnect structure for an integrated circuit comprising:

providing a substrate on which a surface of the substrate and an active area are exposed;

depositing a refractory metal over at least a portion of the active area and the exposed surface of the substrate;

depositing a silicon source layer over the refractory metal;

patterning and removing selected regions of the silicon source layer to expose regions of the refractory metal defining a local interconnect pattern;

reacting regions of the silicon source layer with the refractory metal creating a local interconnect structure;

removing un-reacted refractory metal;

forming an interlevel dielectric having a recess defined therein and substantially aligned with the active area; and depositing an electrically conductive material in the recess.

24. The method of claim 23, wherein the silicon source layer is selected from the group consisting essentially of silicon rich silicon nitride, silicon oxynitride, and mixtures thereof.

25. The method of claim 23, wherein the silicon source layer comprises $Si_xN_yO_z$ wherein x is about 0.39 to about 0.65, y is about 0.02 to about 0.56, and z is about 0.05 to about 0.33.

26. The method of claim 23, wherein the silicon source layer does not comprise polysilicon.

27. The method of claim 23 wherein the refractory metal is selected from the group consisting essentially of titanium, titanium nitride, cobalt, cobalt nitride, and mixtures thereof.

28. The method of claim 23, wherein the refractory metal is removed using an etchant that is selective to a refractory metal silicide.

29. A method of forming a local interconnect structure for an integrated circuit comprising:

providing a substrate having a surface and including at least one topographical structure thereon such that a region of the surface of the substrate is exposed;

forming an active area in the substrate;

depositing a silicide forming material over the active area and at least a portion of the topographical structure;

depositing a silicon source layer on selected regions of the silicide forming material;

making a silicide layer from the silicide forming material and silicon source layer, the silicide layer creating a portion of the local interconnect structure;

removing un-reacted silicide forming material;

forming an oxide cap over the silicide layer, exposed portions of the topographical structure, and the substrate;

forming a passivation layer over the oxide cap;

defining at least one recess extending through the passivation layer and the oxide cap, the recess substantially aligned over the active area or a portion of the topographical structure; and depositing an electrically conductive material in the recess.

30. The method of claim 29, wherein the silicon source layer is selected from the group consisting essentially of silicon rich silicon nitride, silicon oxynitride, and mixtures thereof.

31. The method of claim 29, wherein the silicon source layer comprises $Si_xN_yO_z$ wherein x is about 0.39 to about 0.65, y is about 0.02 to about 0.56, and z is about 0.05 to about 0.33.

32. The method of claim 29, wherein the silicon source layer does not comprise polysilicon.

33. A method of manufacturing an integrated circuit device comprising:

providing a substrate having a surface including at least one topographical structure thereon such that a region of the surface of the substrate is exposed;

forming at least one active area in the substrate adjacent the at least one topographical structure;

forming a refractory metal over the exposed region of the substrate, at least a portion of the at least one active area, and at least a portion of the at least one topographical structure;

forming a silicon source layer over the refractory metal;

patterning and removing selected portions of the silicon source layer such that selected regions of the refractory metal structure are exposed;

annealing to form a refractory metal silicide;

removing un-reacted refractory metal after the refractory metal silicide is formed;

forming an interlevel dielectric having a recess defined therein and substantially aligned with at least a portion of the at least one active area or at least a portion of the at least one topographical structure; and depositing an electrically conductive material in the recess.

34. The method of claim 33, wherein the silicon source layer comprises $Si_xN_yO_z$ wherein x is about 0.39 to about 0.65, y is about 0.02 to about 0.56, and z is about 0.05 to about 0.33.

35. The method of claim 33, wherein the silicon source layer is selected from the group consisting essentially of silicon rich silicon nitride, silicon oxynitride, and mixtures thereof.

36. A method of manufacturing a semiconductor device comprising:

providing a substrate having at least one gate stack thereon;

forming at least one active area in the substrate immediately adjacent the at least one gate stack;

forming a refractory metal over a portion of the at least one active area and over at least a portion of the at least one gate stack;

depositing a silicon source layer on the refractory metal;

removing selected regions of the silicon source layer to define a local interconnect structure over a portion of the at least one active area or the at least one gate stack;

reacting refractory metal covered by the silicon source layer with the silicon source layer to form a silicide layer;

forming an oxide cap over the silicide layer, exposed portions of the at least one gate stack and the substrate;

forming a passivation layer over the oxide cap;

defining at least one recess extending through the passivation layer and the oxide cap, the recess substantially aligned over a portion of the at least one active area or the at least one gate stack; and depositing an electrically conductive material in the recess.

37. A method of manufacturing an integrated circuit comprising:

forming an active area in a substrate;

forming a topographical device on the substrate;

depositing a layer of a refractory metal over a surface of the substrate and over the topographical structure forming a silicon source layer over the refractory metal, the silicon source layer comprising a material selected from the group consisting essentially of silicon rich silicon nitride, silicon oxynitride, and mixtures thereof;

removing selected regions of the silicon source layer to define a local interconnect pattern on the refractory metal;

forming a refractory metal silicide layer from the refractory metal and the silicon source layer to form a portion of a local interconnect structure;

removing refractory metal after the refractory metal silicide is formed;

forming an interlevel dielectric over the silicide layer, the interlevel dielectric having recesses defined substantially over a portion of the active area and a portion of the topographical structure; and depositing an electrically conductive material in the recesses.

38. A method of forming a local interconnect structure for an integrated circuit comprising:

providing a substrate having a surface and including at least one topographical structure thereon such that a region of the surface of the substrate is exposed;

forming at least one active area in the substrate;

forming a silicon source layer over the at least one active area and at least a portion of the at least one topographical structure, wherein the silicon source layer is selected from the group consisting essentially of silicon rich silicon nitride, silicon oxynitride, and mixtures thereof;

depositing a refractory metal directly on selected regions of the silicon source layer and over the at least one topographical structure;

forming a silicide layer from the refractory metal and silicon source layer, the silicide layer defining a portion of the local interconnect structure;

removing the refractory metal;

forming an interlevel dielectric over the silicide layer, the interlevel dielectric having a recess defined substantially over the at least one active area; and depositing an electrically conductive material in the recess.

39. A method of forming a local interconnect structure for an integrated circuit comprising:

providing a substrate having a surface and including at least one topographical structure thereon such that a region of the surface of the substrate is exposed;

forming at least one active area in the substrate;

forming a silicon source layer over the at least one active area and at least a portion of the at least one topographical structure, wherein the silicon source layer comprises $Si_xN_yO_z$ wherein x is about 0.39 to about 0.65, y is about 0.02 to about 0.56, and z is about 0.05 to about 0.33;

depositing a refractory metal directly on selected regions of the silicon source layer and over the at least one topographical structure;

forming a silicide layer from the refractory metal and silicon source layer, the silicide layer defining a portion of the local interconnect structure;

removing the refractory metal;

forming an interlevel dielectric over the silicide layer, the interlevel dielectric having a recess defined substantially over the at least one active area; and depositing an electrically conductive material in the recess.

40. A method of forming a local interconnect structure for an integrated circuit comprising:

providing a substrate having a surface and including at least one topographical structure thereon such that a region of the surface of the substrate is exposed;

forming at least one active area in the substrate;

forming a silicon source layer over the at least one active area and at least a portion of the at least one topographical structure;

depositing a refractory metal directly on selected regions of the silicon source layer and over the at least one topographical structure, wherein the refractory metal is selected from the group consisting essentially of titanium nitride, cobalt, cobalt nitride, and mixtures thereof;

forming a silicide layer from the refractory metal and silicon source layer, the silicide layer defining a portion of the local interconnect structure;

removing the refractory metal;

forming an interlevel dielectric over the silicide layer, the interlevel dielectric having a recess defined substantially over the at least one active area; and depositing an electrically conductive material in the recess.

41. A method of forming a local interconnect structure for an integrated circuit comprising:

providing a substrate having a surface and including at least one topographical structure thereon such that a region of the surface of the substrate is exposed;

forming at least one active area in the substrate;

forming a silicon source layer over the at least one active area and at least a portion of the at least one topographical structure;

depositing a refractory metal directly on selected regions of the silicon source layer and over the at least one topographical structure, wherein the refractory metal is $Ti_xN_y$, wherein y is from about 0.01 to about 0.15;

forming a silicide layer from the refractory metal and silicon source layer, the silicide layer defining a portion of the local interconnect structure;

removing the refractory metal;

forming an interlevel dielectric over the silicide layer, the interlevel dielectric having a recess defined substantially over the at least one active area; and depositing an electrically conductive material in the recess.

42. A method of forming a local interconnect structure for an integrated circuit comprising:

providing a substrate having a surface and including at least one topographical structure thereon such that a region of the surface of the substrate is exposed;

forming at least one active area in the substrate;

forming a silicon source layer over the at least one active area and at least a portion of the at least one topographical structure;

depositing a refractory metal directly on selected regions of the silicon source layer and over the at least one topographical structure;

forming a silicide layer from the refractory metal and silicon source layer, the silicide layer defining a portion of the local interconnect structure;

removing the refractory metal;

forming an interlevel dielectric over the silicide layer and the silicon source layer, the interlevel dielectric having a recess defined substantially over the at least one active area; and depositing an electrically conductive material in the recess.

43. A method of manufacturing a semiconductor device comprising:

providing a substrate having a principal surface including at least one gate stack formed thereon such that a region of the principal surface of the substrate is exposed;

forming an active area in the substrate immediately adjacent the gate stack;

forming a silicon source layer over at least a portion of the active area and over at least a portion of the gate stack, wherein the silicon source layer does not comprise polysilicon;

depositing a refractory metal on selected regions of the silicon source layer;

creating a silicide layer from the refractory metal and silicon source layer, the silicide layer forming a portion of a local interconnect structure;

forming a passivation layer on the silicide layer and silicon source layer, the passivation layer having a recess formed therein, the recess being substantially aligned with a portion of the silicide layer; and depositing an electrically conductive material in the recess.

* * * * *